(12) United States Patent
Javorka et al.

(10) Patent No.: US 9,177,803 B2
(45) Date of Patent: Nov. 3, 2015

(54) HK/MG PROCESS FLOWS FOR P-TYPE SEMICONDUCTOR DEVICES

(71) Applicant: GLOBALFOUNDRIES Inc., Grand Cayman (KY)

(72) Inventors: Peter Javorka, Radeburg (DE); Juergen Faul, Dresden (DE); Ralf Richter, Radebeul (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 15 days.

(21) Appl. No.: 14/175,288

(22) Filed: Feb. 7, 2014

(65) Prior Publication Data

US 2014/0264617 A1 Sep. 18, 2014

Related U.S. Application Data

(60) Provisional application No. 61/783,413, filed on Mar. 14, 2013.

(51) Int. Cl.
| | |
|---|---|
| *H01L 21/8234* | (2006.01) |
| *H01L 21/265* | (2006.01) |
| *H01L 21/28* | (2006.01) |
| *H01L 21/8238* | (2006.01) |
| *H01L 29/49* | (2006.01) |
| *H01L 29/51* | (2006.01) |
| *H01L 29/66* | (2006.01) |

(52) U.S. Cl.
CPC .......... *H01L 21/28* (2013.01); *H01L 21/26586* (2013.01); *H01L 21/28255* (2013.01); *H01L 21/823412* (2013.01); *H01L 21/823807* (2013.01); *H01L 29/495* (2013.01); *H01L 29/51* (2013.01); *H01L 29/66651* (2013.01)

(58) Field of Classification Search
CPC .................. H01L 21/28; H01L 27/088; H01L 21/823412; H01L 21/823807; H01L 21/26586; H01L 29/1083; H01L 29/66636; H01L 29/6628; H01L 28/255; H01L 29/51; H01L 29/6651; H01L 29/495
See application file for complete search history.

(56) References Cited

U.S. PATENT DOCUMENTS

| | | | | |
|---|---|---|---|---|
| 8,598,007 | B1* | 12/2013 | Flachowsky et al. | 438/303 |
| 2004/0180483 | A1* | 9/2004 | Park et al. | 438/197 |
| 2006/0071278 | A1* | 4/2006 | Takao | 257/365 |

(Continued)

FOREIGN PATENT DOCUMENTS

| | | | | |
|---|---|---|---|---|
| TW | 201019155 A1 | 5/2010 | | G06F 17/50 |
| TW | 201019381 A1 | 5/2010 | | H01L 21/28 |
| TW | 201301404 A1 | 1/2013 | | H01L 21/336 |

OTHER PUBLICATIONS

Translation of Official Action from Taiwanese Patent Application No. 103105240, dated Jul. 15, 2015.

*Primary Examiner* — Jarrett Stark
*Assistant Examiner* — Bitew Dinke
(74) *Attorney, Agent, or Firm* — Amerson Law Firm, PLLC

(57) ABSTRACT

The present disclosure provides semiconductor device structures with a first PMOS active region and a second PMOS active region provided within a semiconductor substrate. A silicon germanium channel layer is only formed over the second PMOS active region. Gate electrodes are formed over the first and second PMOS active regions, wherein the gate electrode over the second PMOS active region is formed over the silicon germanium channel.

5 Claims, 7 Drawing Sheets

(56) References Cited

U.S. PATENT DOCUMENTS

| | | | |
|---|---|---|---|
| 2006/0281239 A1* | 12/2006 | Mathew | 438/197 |
| 2008/0160683 A1* | 7/2008 | Vanderpool et al. | 438/142 |
| 2009/0001413 A1* | 1/2009 | Gauthier et al. | 257/190 |
| 2009/0108295 A1* | 4/2009 | Mowry et al. | 257/190 |
| 2009/0291540 A1* | 11/2009 | Zhang et al. | 438/229 |
| 2010/0047985 A1* | 2/2010 | Murthy et al. | 438/303 |
| 2010/0109044 A1* | 5/2010 | Tekleab et al. | 257/190 |
| 2010/0155855 A1* | 6/2010 | Anderson et al. | 257/392 |
| 2010/0216288 A1* | 8/2010 | Chiu et al. | 438/231 |
| 2010/0289094 A1* | 11/2010 | Reichel et al. | 257/409 |
| 2011/0034016 A1* | 2/2011 | Snyder et al. | 438/586 |
| 2011/0127617 A1* | 6/2011 | Scheiper et al. | 257/402 |
| 2011/0147850 A1* | 6/2011 | Nandakumar et al. | 257/368 |
| 2011/0156172 A1* | 6/2011 | Kronholz et al. | 257/402 |
| 2011/0163386 A1* | 7/2011 | Jeong et al. | 257/369 |
| 2011/0278646 A1* | 11/2011 | Ng et al. | 257/192 |
| 2012/0049194 A1* | 3/2012 | Scheiper et al. | 257/65 |
| 2012/0153401 A1* | 6/2012 | Javorka et al. | 257/392 |
| 2012/0280289 A1* | 11/2012 | Flachowsky et al. | 257/288 |
| 2012/0282744 A1* | 11/2012 | Javorka et al. | 438/199 |
| 2012/0302023 A1* | 11/2012 | Javorka et al. | 438/285 |
| 2012/0319207 A1 | 12/2012 | Iijima | 257/369 |
| 2013/0228835 A1* | 9/2013 | Ellis-Monaghan et al. | 257/288 |

* cited by examiner

HK/MG PROCESS FLOWS FOR P-TYPE SEMICONDUCTOR DEVICES

BACKGROUND OF THE INVENTION

1. Field of the Invention

The present disclosure relates to HK/MG process flows for P-type semiconductor devices, and, more particularly, to HK/MG process flows using channel silicon germanium for work function tuning for various types of PMOS devices.

2. Description of the Related Art

The majority of present-day integrated circuits (ICs) are implemented by using a plurality of interconnected field effect transistors (FETS), also called metal oxide semiconductor field effect transistors (MOSFETS) or simply MOS transistors. Typically, present-day integrated circuits are implemented by millions of MOS transistors which are formed on a chip having a given surface area.

In MOS transistors, a current flow through a channel formed between the source and drain of a MOS transistor is controlled via a gate which is typically disposed over the channel, independent from whether a PMOS transistor or an NMOS transistor is considered. For controlling a MOS transistor, a voltage is applied to the gate electrode of the gate and, when the applied voltage is greater than a threshold voltage, a current flow through the channel is induced. The threshold voltage, therefore, represents the switching characteristic of a MOS transistor and the performance of a MOS transistor depends crucially on how accurate the threshold voltage can be implemented. Adjusting the threshold voltage to a specific value during fabrication of a transistor represents a highly sophisticated task because the threshold voltage depends in a nontrivial manner on various properties of a transistor, such as size, material, etc. It is easy to see that further tuning and adjustment is necessary during fabrication processes to define threshold voltages at specific threshold levels in dependence on the specific application in which the transistor is to be employed. However, any process sequence employed in the fabrication of a MOS transistor should avoid inducing undesired variations in the threshold voltage.

Generally, current technologies providing more compact and functional electronic devices require semiconductor devices with exactly adjusted threshold voltages at different threshold voltage levels. Therefore, devices with different device types, also called flavors, are considered, such as, for example, low threshold voltage (LVT) devices, regular threshold voltage (RVT) devices, high threshold voltage (HVT) devices, and super high threshold voltage (SHVT) devices. Herein, the threshold voltage level of HVT devices is greater than the threshold voltage of RVT devices by about 80 mV. SHVT devices even show a delta in the threshold voltage level relative to RVT devices in the range of about 140-160 mV. Conventionally, complex IC structures may have a great number of LVT devices, RVT devices, HVT devices and SHVT devices, whereas the threshold voltages of one type of device should not show unacceptable variations relative to a desired value. Accordingly, efforts are directed to tune, adjust or even compensate for differences in the threshold voltage and to minimize unwanted variations during fabrication.

Conventionally, some measures for tuning the threshold voltage involve performing implantation processes which are adapted for each semiconductor device type individually for appropriately setting the required threshold voltage to a desired value. For example, halo implantation processes are conventionally performed for adjusting the threshold voltage when fabricating modern semiconductor devices, such as MOS transistors, with short channels, e.g., less than 50 nm channel length. Herein, the accordingly formed halo regions encompass source and drain extension regions of each transistor towards the channel. Basically, halo regions are regions doped with dopants of similar conductivity type as those that are present in the surrounding active region, therefore representing counter-doped regions with regard to the source and drain doping. However, the dopant concentration in halo regions is higher as compared to the surrounding active regions. At present, halo regions represent conventional measures employed for reducing so-called short channel effects which appear at small gate lengths scales and short channel lengths scales, respectively. It is apparent that, with devices of various device types or flavors possibly being formed in different regions across a single semiconductor wafer, individual tuning in each region becomes necessary in order to minimize unwanted variations. The result is a complex process flow, even posing the risk of introducing unacceptably high variations of the threshold voltage across the wafer due to the inclusion of new processes, as will be more apparent from the discussion below.

As described above, the threshold voltage depends on many different factors, of which a transistor's work function represents an important characteristic. In PMOS devices, for example, tuning of the work function involves forming a thin channel of silicon germanium material over the channel region of a transistor. The channel of silicon germanium material, often referred to as silicon germanium channel (cSiGe), is conventionally disposed between the channel region located within the semiconductor substrate and the gate electrode formed over the semiconductor substrate. Typically, cSiGe has a thickness in a range from about 80-100 Å. It is important to note that the thickness of the cSiGe has significant impact on the threshold voltage of respective PMOS transistors and any variation of the cSiGe induces a variation in the threshold voltage.

It is, thus, evident that controlling the threshold voltage of a MOS transistor is an intricate task, which becomes more complicated when applied to different types of MOS transistor devices with different levels of threshold voltages.

A further complication arises when considering the following: According to conventional process flows, each device is exposed to various implantation sequences, such as halo implantation processes, as described above. However, each device type needs to be exposed to a different implantation process for appropriately setting the threshold voltage for each single device type so as to implement various different levels of threshold voltages in dependence on the required flavor or type. That is, a variety of different implant processes are required, wherein each implantation process involves its dedicated mask pattern for reliably doping dedicated device regions and thereby tuning the threshold voltage to a desired level. As the required implantation dosages are used to compensate for unwanted differences in the threshold voltage, depending on the device type, conventionally, increased halo implantation dosages are used in the case of HVT and SHVT devices. On the other hand, high implantation dosages raise the problem of performance degradation, which is unacceptable, especially for advanced semiconductor devices. For example, an increased number of implantation sequences involves an increased number of additional masking and removal sequences, which introduce further risks of shifting the threshold voltage in an uncontrolled manner.

The above outlined problematic will be illustrated with regard to FIG. 1 which schematically illustrates how the performance of HVT and SHVT type semiconductor devices is degraded relative to RVT and LVT devices. A reason for this is seen in the extremely high halo implant doses for HVT and SHVT devices as compared to RVT and LVT devices. Masking patterns that are exposed to high implantation doses show greater resistance when subjected to mask removing processes than masking patterns that are exposed to implantation processes with moderate or low implantation doses. That is, removal of accordingly exposed masking patterns may leave masking residues and, therefore, affect subsequent processing or may damage formed structures.

The graphical representation of FIG. 1 depicts a relation between the drain current in the on-state of the device (IDS plotted on the ordinate) and the drain current in the off-state of the device (IOFF plotted on the abscissa) which is often referred to as the universal curve and which was obtained by the inventors. Herein, measurement points are indicated by triangles. A region indicated by reference SHVT in FIG. 1 denotes measurements performed with SHVT sample devices. A region indicated by reference HVT in FIG. 1 denotes measurements performed with HVT sample devices. A region indicated by reference RVT in FIG. 1 denotes measurements performed with RVT sample devices. A region indicated by reference LVT in FIG. 1 denotes measurements performed with LVT sample devices. As shown in FIG. 1, the drain current in the on-state decreases when comparing the LVT, RVT, HVT and SHVT regions. Particularly, the SHVT and HVT regions show a lower drain current in the on-state as compared to RVT and LVT regions.

In view of the above description it is desirable to provide improved HK/MG process flows for PMOS semiconductor device structures and PMOS device structures such that at least some of the aforementioned degrading effects are reduced, if not avoided.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In accordance with a first aspect of the present disclosure, a method of forming a semiconductor device structure is provided. In some illustrative embodiments, the method includes providing a first PMOS active region and a second PMOS active region in a semiconductor substrate, forming a first masking pattern over the first PMOS active region, forming a silicon germanium layer over the second PMOS active region in accordance with the first masking pattern, removing the first masking pattern, and forming gate electrode structures over the first and second PMOS active regions.

In accordance with a second aspect of the present disclosure, a method of forming a semiconductor device structure is provided. In some illustrative embodiments, the method includes providing a semiconductor substrate with a first active region and a second active region, of which only the second active region has a silicon germanium layer formed thereon, providing a first PMOS device formed on the first active region, the first PMOS device comprising a first gate electrode structure, providing a second PMOS device formed over the second active region, the second PMOS device comprising a second gate electrode structure formed on the silicon germanium layer, and performing a first implantation process for forming halo regions in the second active region at opposing sides of the second gate electrode structure while the first active region is protected by a masking pattern from being exposed to the first implantation process.

In accordance with a third aspect of the present disclosure, a semiconductor device structure is provided. In some illustrative embodiments, the semiconductor device structure includes a semiconductor substrate with a first active region and a second active region, of which only the second active region has a silicon germanium layer formed thereon, a first PMOS device formed on the first active region, the first PMOS device having a first gate electrode structure, and a second PMOS device formed over the second active region, the second PMOS device having a second gate electrode structure disposed on the silicon germanium layer.

BRIEF DESCRIPTION OF THE DRAWINGS

The disclosure may be understood by reference to the following description taken in conjunction with the accompanying drawings, in which like reference numerals identify like elements, and in which.

Figure 1:
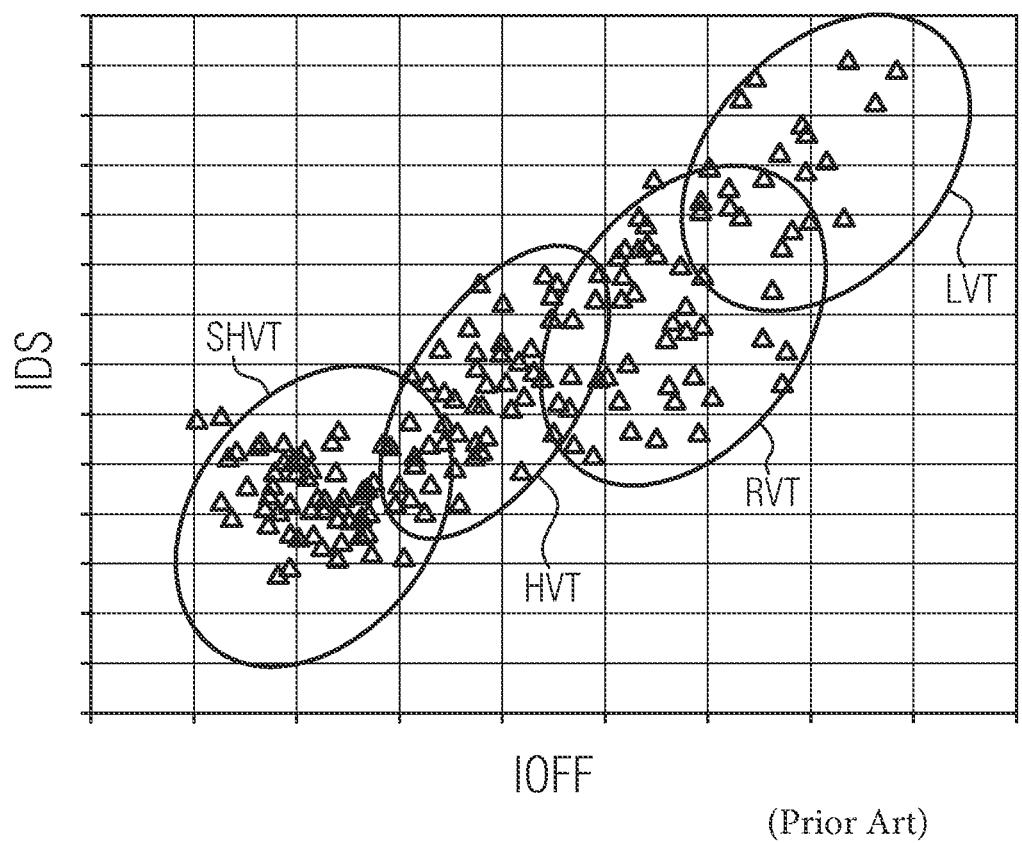
FIG. 1 schematically illustrates a relation representing a universal curve for HVT, SHVT, LVT and RVT sample devices as obtained by the inventors.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present invention relates to methods of forming a semiconductor device structure and to a semiconductor device structure. Semiconductor device structures may comprise a plurality of semiconductor devices integrated on or in a chip, such as a plurality of metal oxide semiconductor devices (MOS devices). When referring to MOS devices, the person skilled in the art will appreciate that, although the expression "MOS device" is used, no limitation to a metal-containing gate material and/or to an oxide-containing gate dielectric material is intended.

As illustrated in the following detailed description of some illustrative embodiments of the present disclosure, semiconductor devices may be provided by MOS devices which are manufactured by employing advanced technologies. For example, semiconductor device structures of the present disclosure may be fabricated by technologies approaching technology nodes smaller than 100 nm, for example smaller than 50 nm or smaller than 35 nm. The person skilled in the art will appreciate that the present disclosure considers semiconductor device structures with semiconductor devices having minimal length dimensions and/or minimal width dimensions smaller than 100 nm, for example smaller than 50 nm or smaller than 35 nm.

In describing the following figures, integrated circuit elements and methods of forming semiconductor device structures in accordance with various exemplary embodiments of the present disclosure will be illustrated. The described processes, process sequences, process steps, procedures and materials are to be considered only as representing exemplary embodiments designed to illustrate to one of ordinary skill in the art methods for practicing the invention. However, it is to be understood that the invention is not exclusively limited to the illustrated and described exemplary embodiments as many possible modifications and changes exist which will become clear to the ordinary person skilled in the art when studying the present detailed description together with the accompanied drawings and the above background and summary of the invention. Illustrated portions of semiconductor device structures may include only a single element, although those skilled in the art will recognize that actual implementations of semiconductor device structures may include a large number of semiconductor devices.

The person skilled in the art understands that semiconductor devices may be fabricated as P-channel MOS devices or PMOS devices and as N-channel devices or NMOS devices, and both may be fabricated with or without mobility enhancing stressor features or strain-inducing features. Particularly, in the case of PMOS devices, P-doped source/drain regions are formed in a usually neutral or slightly N-doped semiconductor substrate or in an N-well formed in a portion of a semiconductor substrate, in which a conductive channel is induced in the conducting or on-state of the device.

Various steps in the fabrication of semiconductor devices are well known and so, in the interest of brevity, many conventional steps will be herein only mentioned briefly, or will be omitted entirely without providing the well-known process details.

In some aspects of the present disclosure, a semiconductor device structure may comprise a first PMOS active region and a second PMOS active region provided in a semiconductor substrate. In accordance with some illustrative embodiments herein, the semiconductor device structure may be formed by forming a first masking pattern over the first PMOS active region. In accordance with the first masking pattern, a silicon germanium layer may be formed over the second PMOS active region. After removing the first masking pattern over the first PMOS active region, gate electrode structures are formed over the first and second PMOS active regions.

In some illustrative embodiments herein, the first masking pattern may be formed by depositing a masking layer over the first and second PMOS active regions and using lithography techniques to form a masking pattern for exposing the second PMOS active region while covering the first PMOS active region. Therefore, the silicon germanium layer may be deposited on the second PMOS active region and not on the first PMOS active region.

In some illustrative embodiments, the first PMOS active region may be only subjected to doping by group 3 elements, group 3 comprising B, Al, Ga and In, for example. Therefore, one or more implantation processes may be performed for implanting dopants into the first PMOS active region, wherein the dopants are only given by group 3 elements. Therefore, source/drain regions or source/drain regions together with source/drain extension regions are formed in the first PMOS active region. However, counter-doped regions, such as halo regions, which show a counter-doping with regard to the source/drain regions, are not formed in the first PMOS active region. Therefore, a PMOS device provided in the first PMOS active region does not have counter-doped regions. In some special examples, boron (B) may be the only dopant used for doping the first PMOS active region.

In some illustrative embodiments, the one or more implantation processes for implanting dopants into the first PMOS active region may be performed, wherein the dopants are substantially implanted along a direction normal to an exposed surface of the first PMOS active region.

In some illustrative embodiments, a second masking pattern may be formed over the first PMOS active region after having formed the gate electrode structures. In accordance with the second masking pattern, a first implantation process with a first halo implant dose may be performed for forming halo regions in the second PMOS active region. Therefore, halo regions are provided at opposing sides of a gate electrode structure which is formed over the silicon germanium layer on the second PMOS active region. Accordingly, a threshold voltage of the gate electrode structure formed over the second PMOS active region is adjusted.

In some illustrative examples herein, a third masking pattern may be formed over the second PMOS active region and a second implantation process with a second halo dose may be performed for forming lightly-doped halo regions in the first PMOS active region in accordance with the third masking pattern. Herein, the second halo dose is substantially smaller than the first halo dose. Accordingly, halo regions may be formed in the first PMOS active region by means of the second implantation process and the accordingly formed halo regions in the first PMOS active region may have a dopant concentration that is substantially lower than the dopant concentration of halo regions formed in the second PMOS active region.

In other aspects of the present disclosure, a semiconductor device structure with a semiconductor substrate and a first PMOS active region and a second PMOS active region may be formed, wherein, of the first PMOS active region and the second PMOS active region, only the second PMOS active region has a silicon germanium layer formed thereon. A first PMOS device comprising a first gate electrode structure is formed on the first PMOS active region. A second PMOS device is formed over the second active region, wherein the second PMOS device comprises a second gate electrode structure formed on the silicon germanium layer. In performing a first implantation process for forming halo regions in the second PMOS active region at opposing sides of the second gate electrode structure, while the first PMOS active region is protected by a masking pattern from being exposed to the first implantation process, halo regions are formed in the second PMOS active region.

In some illustrative embodiments, a second implantation process for forming halo regions in the first PMOS active region may be performed subsequently to the first implantation process, with the second implantation process having an implantation dose that is substantially smaller than an implantation dose of the first implantation process. In this way, halo regions are formed in the first PMOS active region at opposing sides of the first gate electrode structure, wherein a dopant concentration within the halo regions in the first PMOS active region is substantially lower than a dopant concentration within halo regions formed in the second PMOS active region.

In some illustrative embodiments, one or more doping implantation processes into the first PMOS active region may be performed, wherein the first PMOS active region is only subjected to doping implantation processes involving group 3 elements. Therefore, the first PMOS device may only comprise doped regions that have dopants given by group 3 elements implanted therein. Particularly, the first PMOS device may not have any counter-doped regions relative to the source/drain regions.

In some illustrative embodiments, the one or more doping implantation processes into the first PMOS active region may be performed, wherein the one or more doping implantation processes are substantially normal to an exposed surface of the first PMOS active region.

In further aspects of the present disclosure, semiconductor device structures are provided which comprise a semiconductor substrate with a first PMOS active region and a second PMOS active region, of which only the second PMOS active region has a silicon germanium layer formed thereon. A first PMOS device is formed on and in the first PMOS active region, wherein the first PMOS device has a first gate electrode structure. A second PMOS device is formed over the second active region, wherein the second PMOS device has a second gate electrode structure disposed on the silicon germanium layer.

In some illustrative embodiments, out of the first and second PMOS active regions, halo regions are only formed in the second PMOS active region. Therefore, only the second PMOS device has counter-doped regions relative to source/drain regions.

In some illustrative embodiments, the first PMOS device is of an HVT type and the second PMOS device is of an LVT type or an RVT type.

In some illustrative embodiments, the first PMOS active region has first halo regions with a first dopant concentration formed therein and the second PMOS active region has second halo regions with a second dopant concentration formed therein, wherein the first dopant concentration is substantially smaller than the second dopant concentration. Therefore, the first PMOS device has halo regions showing a dopant concentration that is substantially lower than a concentration of dopants within the halo regions of the second PMOS device. In some illustrative examples herein, a ratio of the second dopant concentration to the first dopant concentration may be two or more. Additionally, and/or alternatively, the first PMOS device may be of an SHVT type and the second PMOS device may be of an RVT type or an LVT type.

In some illustrative embodiments, the first PMOS active region is doped with dopants which only comprise group 3 elements. Therefore, the first PMOS device may only have dopants provided by group 3 elements implanted therein. In some special examples, the first active region may be only doped with boron (B).

Some illustrative embodiments of the various aspects of the present disclosure will be now described with regard to FIGS. 2a to 6 in greater detail.

Figure 2A:
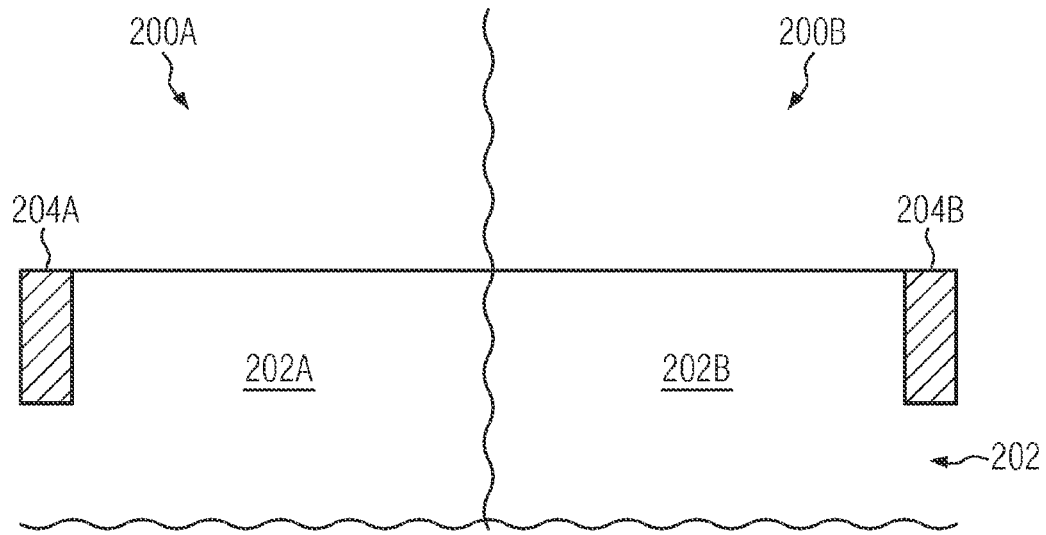
FIGS. 2a-2e schematically show in cross-sectional views a method of forming a semiconductor device structure at relatively early stages during fabrication in accordance with some illustrative embodiments of the present disclosure.

FIG. 2a schematically shows a cross-sectional view of a semiconductor device structure at an early stage during fabrication, wherein, for ease of illustration, only two semiconductor devices 200A and 200B are depicted. The semiconductor devices 200A and 200B may be provided as neighboring semiconductor devices. However, this does not pose any limitation to the present disclosure and the person skilled in the art will appreciate that the semiconductor devices 200A and 200B may be formed as distanced semiconductor devices which are separated by one or more semiconductor devices (not illustrated) that are located in between. For example, one of the semiconductor devices 200A and 200B may be formed at peripheral regions of an integrated circuit to be implemented by the semiconductor device structure.

At the fabrication stage illustrated in FIG. 2a, the semiconductor devices 200A and 200B are to be formed in and on a semiconductor substrate 202. The semiconductor substrate 202 may be a bulk semiconductor substrate, or it may be the semiconductor layer of a so-called SOI (silicon-on-insulator) substrate or a so-called SGOI (silicon-germanium-oninsulator) substrate. The person skilled in the art will appreciate that the terms "substrate," "semiconductor substrate" or "semiconducting substrate" should be understood as covering all semiconductor materials and all forms of such semiconductor materials as known in the art. In some illustrative embodiments of the present disclosure, the semiconductor substrate 202 may be provided by silicon, a silicon-comprising material or a silicon germanium material.

Within the semiconductor substrate 202, active regions 202A and 202B are formed. The active region 202A is associated with the semiconductor device 200A, while the active region 202B is associated with the semiconductor device 200B. In some illustrative embodiments, as depicted in FIG. 2a, the active regions 202A and 202B may be defined by respective trench isolation structures which may be formed in the semiconductor substrate 202. A trench isolation structure defining the active region 202A is represented by an STI region 204A in FIG. 2a, while a trench isolation structure defining the active region 202B is given by an STI region 204B. The person skilled in the art will appreciate that only a portion of the active regions 202A and 202B is illustrated in FIG. 2a for ease of illustration. For example, one or more additional STI regions (not illustrated) may be formed in between the active regions 202A and 202B such that the active region 202A is separated from the active region 202B.

The expression "active region" is to be understood herein as representing an undoped region or a doped region of a semiconductor substrate, in and on which region a semiconductor device is to be fabricated. In case of a PMOS device, an active region may represent an N-doped region formed within a surface region of a semiconductor substrate. The N-doped region may be implanted in some previous implantation process(es) or may be provided by an accordingly pre-doped semiconductor substrate. For example, active regions may be provided by defining a plurality of regions within a surface region of a semiconductor substrate by forming trench isolation structures delineating the regions. In case the accordingly-formed regions do not show an appropriate conductivity due to the semiconductor substrate being undoped or the semiconductor substrate being pre-doped with a dopant of opposed conductivity type, a doping of at least some of the delineated regions may result in active regions doped with a desired conductivity type. In this way, the active region of PMOS devices may be provided with an N-type dopant configuration. In this way, a plurality of differently-doped active regions may be provided by accordingly patterning the delineated regions with appropriately patterned masking structures and by introducing appropriate dopants into active regions in accordance with the masking structure.

In accordance with the above description, the active regions 202A and 202B are configured such that the devices 200A and 200B may be fabricated as PMOS devices. Therefore, the active regions 202A and 202B may be understood as representing a first PMOS active region 202A and a second PMOS active region 202B, in and on which a first PMOS device 200A and a second PMOS device 200B are to be formed. In some explicit illustrative embodiments of the present disclosure, at least one of the first and second PMOS active regions may be doped. In some explicit illustrative embodiments of the present disclosure, at least one of the first and second PMOS active regions may be undoped.

Figure 2B:
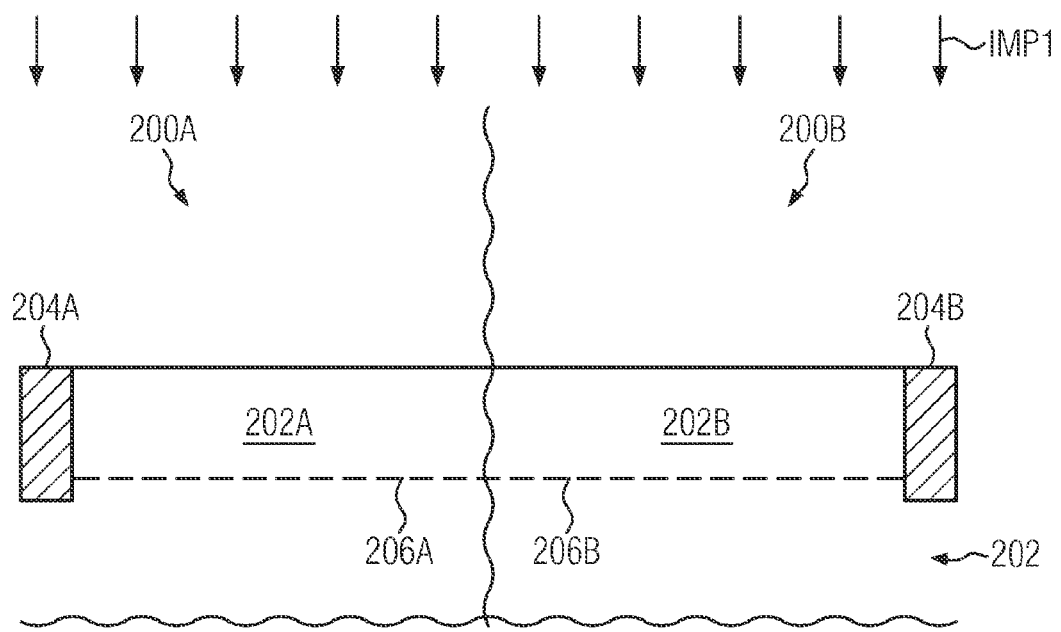

In some illustrative embodiments, as described with regard to FIGS. 2a and 2b, the active regions 202A and 202B are formed in the semiconductor substrate 202, wherein the semiconductor substrate 202 is either undoped or slightly P-doped. In this case, as shown in FIG. 2b, the active regions 202A and 202B may be formed by delineating regions 202A and 202B in the semiconductor substrate 202 by STI regions 204A and 204B as depicted in FIG. 2a and subsequently performing an implantation process IMP1 for implanting N-type dopants into the delineated regions 202A and 202B such that N-doped regions are formed within the semiconductor substrate 202, as indicated by the broken line 206A for the semiconductor device 200A and the broken line 206B for the semiconductor device 200B. Accordingly-doped regions 202A and 202B, as indicated by the broken lines 206A and 206B, implanted by the implantation process IMP1, therefore, form active regions 202A and 202B. This does not pose any limitation to the present disclosure and the implantation process IMP1 may be provided by a plurality of implantation processes.

The illustrative embodiments as described with regard to FIGS. 2a and 2b do not pose any limitation on the present disclosure. Alternatively, one of the two active regions 202A and 202B may be P-typed doped. In still further alternative embodiments, at least one of the two active regions 202A and 202B may be undoped. It is understood that, in the case of the substrate 202 having an initial N-type doping formed therein, no implantation process IMP1 may be necessary.

Figure 2C:
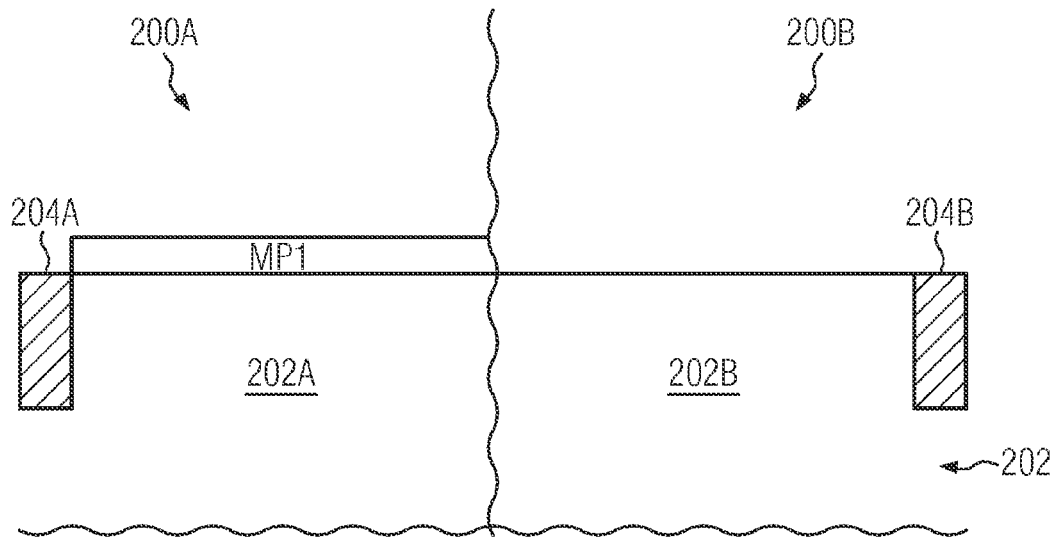
Figure 2D:
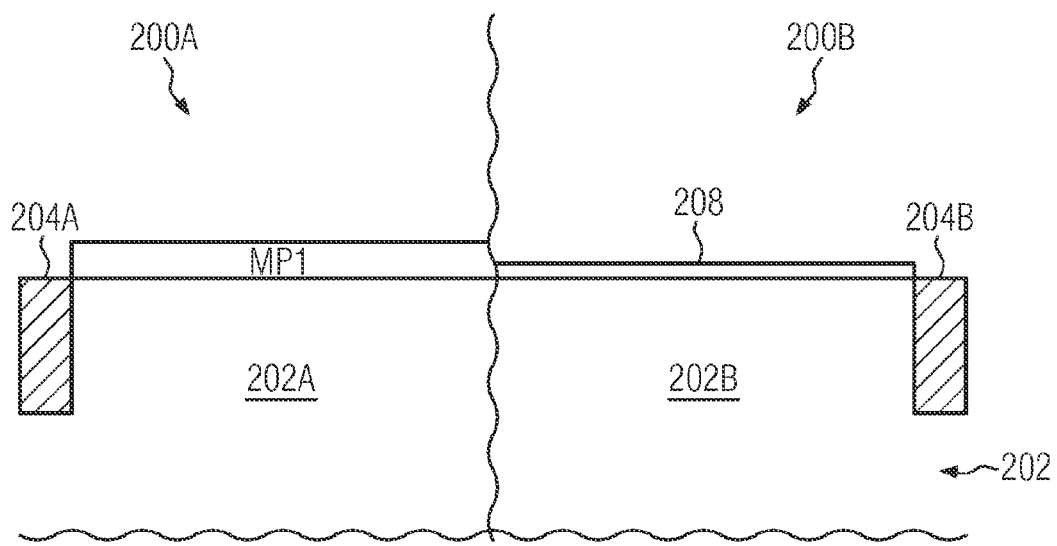
Figure 2E:
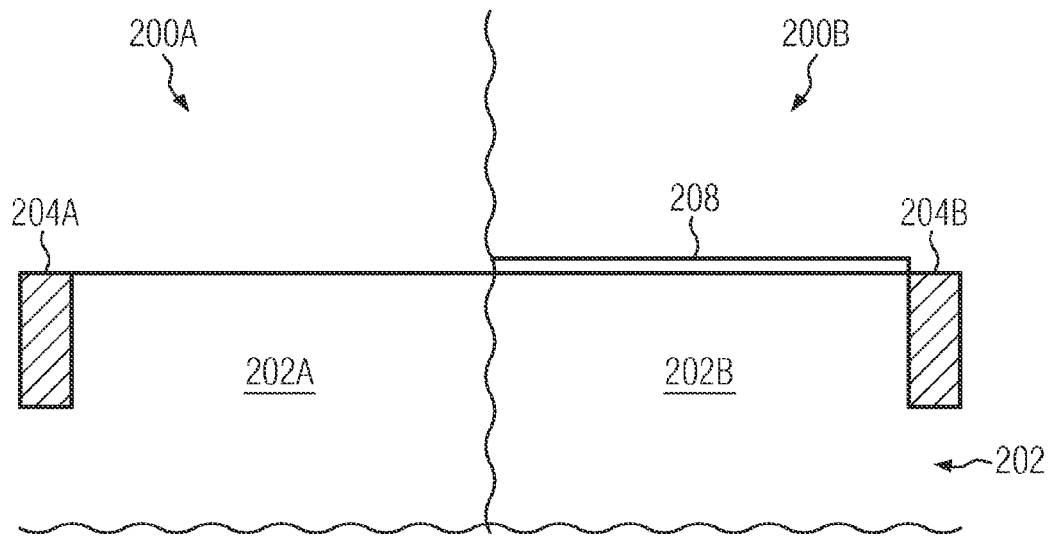

Illustrative embodiments of the present disclosure will be further described with regard to FIGS. 2c-2e. FIG. 2c shows a semiconductor device structure comprising two semiconductor devices 200A and 200B at a more advanced stage during fabrication. The semiconductor devices 200A and 200B may, in particular, represent the semiconductor devices 200A and 200B as described with regard to FIGS. 2a and 2b at a later stage during fabrication.

As shown in FIG. 2c, a first masking pattern MP1 is formed over the active region 202A, while leaving the active region 202B uncovered such that the active region 202B is exposed to subsequent processing. The first masking pattern MP1 may be an appropriately patterned mask or hardmask. For example, the first masking pattern MP1 may be formed by forming a masking layer over the active regions 202A and 202B, such as by depositing a masking material over the semiconductor device structure, and subsequently performing a patterning process, such as employing known lithography techniques, to form the first masking pattern MP1 as illustrated in FIG. 2c.

FIG. 2d shows the semiconductor device structure comprising the semiconductor devices 200A and 200B at a more advanced stage during fabrication. In the illustrated stage, a silicon germanium layer 208 is formed on the active region 202B. The silicon germanium layer 208 may be, for example, formed by selectively depositing silicon germanium on the semiconductor device structure in accordance with the first masking pattern MP1. Accordingly, no silicon germanium is deposited on the active region 202A. Therefore, out of the semiconductor devices 200A and 200B, only the semiconductor device 200B comprises the silicon germanium layer 208 which is formed on the active region 202B.

FIG. 2e shows the semiconductor device structure in accordance with some illustrative embodiments of the present disclosure at a more advanced stage during fabrication. Herein, a process for removing the first masking pattern MP1 has been performed such that the semiconductor device 200A as illustrated in FIG. 2e comprises the active region 202A being exposed to further processing at the depicted stage of fabrication. The semiconductor device 200B comprises the silicon germanium layer 208 which is formed on the active region 202B.

Figure 3A:
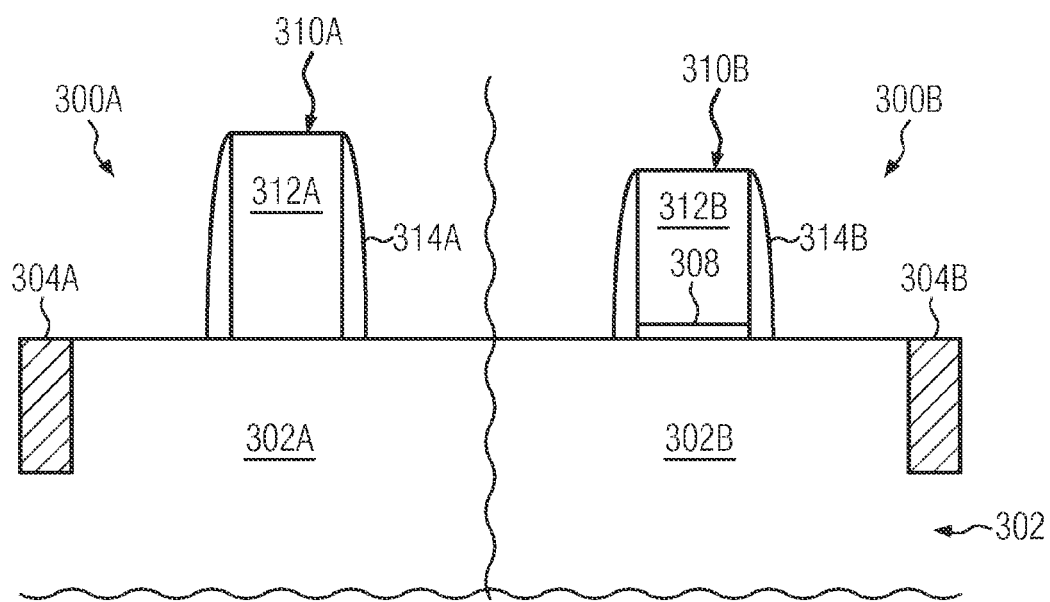
FIGS. 3a-3b schematically show in cross-sectional views a method of forming a semiconductor device structure at more advanced stages during fabrication in accordance with some illustrative embodiments of the present disclosure.

Some illustrative embodiments of the present disclosure will now be described with regard to FIGS. 3a and 3b. FIG. 3a depicts the semiconductor device structure at a more advanced stage during fabrication in accordance with some illustrative embodiments of the present disclosure. The semiconductor device structure comprises a semiconductor device 300A and a semiconductor device 300B, wherein the semiconductor device 300A is formed in and on an active region 302A defined by an STI region 304A. The semiconductor device 300B is formed in and on an active region 302B which is defined by STI regions 304B. The semiconductor devices 300A and 300B may correspond to the respective semiconductor devices 200A and 200B as described with regard to FIGS. 2a-2e above. In some illustrative embodiments of the present disclosure, the semiconductor devices 300A and 300B may represent semiconductor devices obtained by further processing the semiconductor devices 200A and 200B as illustrated in FIG. 2e such that gate electrode structures 310A and 310B are formed on the respective active regions. The gate electrode structures 310A and 310B may be obtained by employing known gate-first processes such that respective gate stacks 312A and 312B are formed over the respective active regions 302A and 302B. Particularly, a gate stack 312A formed on the active region 302A may comprise a gate dielectric, such as, for example, silicon dioxide and/or high-k material layers, and a work function-adjusting material layer and a gate electrode, such as a polysilicon or metal gate electrode. Accordingly, the gate stack 312B formed over the active region 302B and disposed on a silicon germanium layer 308 may comprise a gate dielectric formed by one or more high-k materials, such as hafnium oxide, hafnium silicon oxynitride and the like, a work function-adjusting material layer, such as titan nitride, and a gate electrode, such as a polysilicon or metal gate electrode.

Furthermore, a sidewall spacer structure 314A is formed adjacent to the gate stack 312A. A sidewall spacer structure 314B is formed adjacent to the gate stack 312B. The sidewall spacer structures 314A and 314B may, for example, be provided by one or more layers of insulating material, such as silicon nitride, silicon oxide and the like. In some illustrative examples herein, the sidewall spacer structures 314A and 314B may be provided by a silicon nitride layer.

The person skilled in the art will appreciate that source/drain extension regions (not illustrated) may be formed in the active regions 302A and 302B in alignment with the gate electrode structures 312A and 312B. Herein, the sidewall spacer structures 314A and 314B may be used to define a lateral separation between source/drain extension regions (not illustrated) and, therefore, to adjust an effective gate length. The person skilled in the art will appreciate that, in employing a thermal annealing process (not illustrated), a lateral offset of source/drain extension regions (not illustrated) into a surface region of the active regions 302A and 302B underneath the gate electrode structures 310A and 310B may be further adjusted.

Figure 3B:
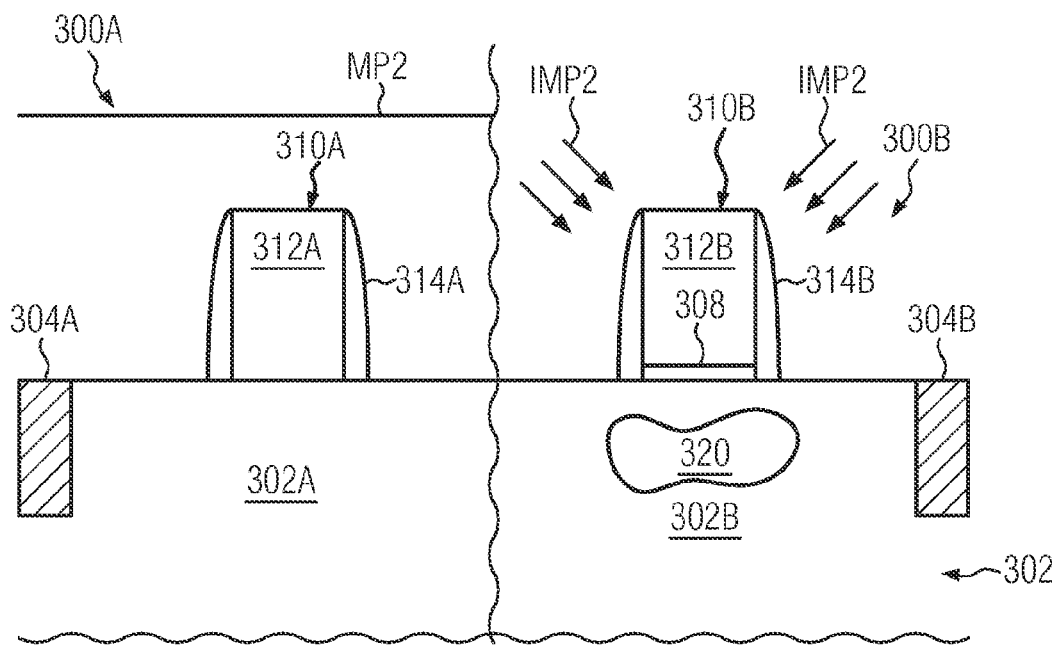

FIG. 3b illustrates the semiconductor device structure as described with regard to FIG. 3a at a more advanced stage during fabrication. As illustrated in FIG. 3b, a second masking pattern MP2 is formed over the semiconductor device 300A, wherein the second masking pattern MP2 leaves the active region 302B uncovered such that the semiconductor device 300B is exposed to further processing, while the semiconductor device 300A is protected from further processing. The second masking pattern MP2 may be formed in employing process sequences as explained above with regard to the first masking pattern MP1 of FIG. 2c.

Further processing may be applied to the semiconductor device 300B while the semiconductor device 300A is protected by the second masking pattern MP2 and, therefore, further processing is performed in alignment with the second masking pattern MP2. As illustrated in FIG. 3b, a second implantation process IMP2 is performed for implanting dopants into the active region 302B such that halo regions 320 are formed within the active region 302B. In some illustrative embodiments, the second implantation process IMP2 may have an implantation dose of greater than about 3.5E13 atoms/cm$^2$. The dopants implanted into the active region 302B during the second implantation process IMP2 are N-type dopants provided by group 5 elements, such as N, P and As, for instance. The person skilled in the art will appreciate that a concentration of dopants within the halo regions 320 may be in the range of about 2.0-8.0E13 atoms/cm$^2$. The second implantation process IMP2 is oriented with regard to a normal direction of an exposed surface of the active region 302B such that an implantation direction of the second implantation process IMP2 assumes an angle relative to the normal direction of about ±30 degrees to an accuracy of less than about 5 degrees.

Subsequent to the second implantation process IMP2, the second masking pattern MP2 may be removed for exposing the semiconductor device 300A and particularly the gate electrode structure 310A.

Figure 4:
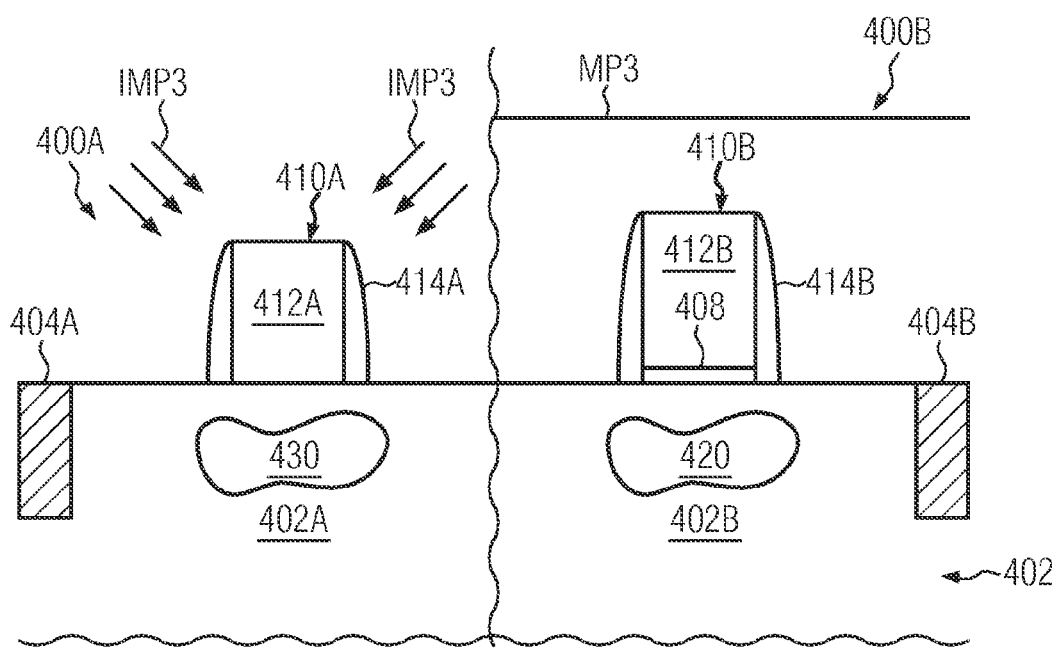
FIG. 4 schematically shows in a cross-sectional view a semiconductor device structure at a more advanced stage during fabrication in accordance with some illustrative embodiments of the present disclosure.

With regard to FIG. 4, some illustrative embodiments of the present disclosure will be described. FIG. 4 depicts a semiconductor device structure comprising semiconductor devices 400A and 400B at a more advanced stage in accordance with some illustrative embodiments of the present disclosure. At the illustrated stage as depicted by FIG. 4, the semiconductor device 400B is covered by a third masking pattern MP3. The third masking pattern MP3 may be formed in analogy with processes as employed with regard to the first masking pattern MP1 illustrated in FIG. 2c and the second masking pattern MP2 as illustrated in FIG. 3b. The third masking pattern MP3 is formed over an active region 402B such that the semiconductor device 400B and a gate electrode structure 410B formed on the active region 402B are protected by the third masking pattern MP3. The gate electrode structure 410B comprises a gate stack 412B, such as, for example, a gate stack similar to the gate stack 312B as described with regard to FIGS. 3a and 3b above. The gate stack 412B is disposed on a silicon germanium layer 408, which corresponds to the silicon germanium layers 208 as described above with regard to FIGS. 2a-2e and the silicon germanium layer 308 as described above with regard to FIGS. 3a-3b. The gate electrode structure 410B further comprises a sidewall spacer structure 414B, which may correspond to the sidewall spacer structure 314B as described above with regard to FIGS. 3a-3b. The active region 402B is defined by STI regions 404B. The STI regions 404B may correspond to the STI regions 204B and 304B as described above with regards to FIGS. 2a-3b.

The third masking pattern MP3 is patterned such that the semiconductor device 400B is covered, while the semiconductor device 400A is uncovered and, therefore, exposed to further processing. The semiconductor device 400A comprises a gate electrode structure 410A, a gate stack 412A and a sidewall spacer structure 414A disposed on an active region 402A. The gate electrode structure 410A and the active region 402A correspond to the gate electrode structure 310A as described above with regard to FIGS. 3a-3b and to the active regions 202A and 302A as described above with regard to FIGS. 2a-3b. Similarly, the active region 402A is defined by STI regions 404A. With regard to the STI regions 404A, reference is made to the corresponding STI regions 204A and 304A as described above with regard to FIGS. 2a-3b.

As depicted in FIG. 4, a third implantation process IMP3 may be performed in accordance with some illustrative embodiments of the present disclosure. The third implantation process IMP3 is performed for implanting dopants into the active region 402A such that halo regions 430 are formed in the active region 402A. Particularly, dopants of group 5 elements are implanted into the active region 402A. The third implantation process IMP3 may have an implantation dose of substantially less than about 3.3E13 atoms/cm$^2$. In some illustrative examples, an implantation dose of the third implantation process IMP3 may be smaller than an implantation dose of the second implantation process IMP2 (FIG. 3b) by at least a factor of 1.5, or by at least a factor of 10, or at least by a factor of 50. The person skilled in the art will appreciate that the third implantation process IMP3 may represent an implantation sequence comprising two implantation steps performed at an angle with an absolute value of about 30 degrees relative to a normal direction of an upper surface of the active region 402A. The halo regions 430 formed in the active region 402A underneath the gate electrode structure 410A may have a dopant concentration of N-type dopants that is substantially lower than a concentration of N-type dopants within the halo regions 420 of the semiconductor device 400B. For example, a concentration of N-type dopants within the halo regions 430 may be smaller than a concentration of N-type dopants within the halo regions 420 by about a factor of 2, or by a factor of about 10, or by a factor of about 50 or more.

The halo regions 320 in FIG. 3b and the halo regions 420 and 430 in FIG. 4 are depicted as one halo region formed under a gate electrode structure within an active region. This does not pose any limitation to the present disclosure and the person skilled in the art will appreciate that, in spite of having a merged halo region as illustrated, two separate halo regions resulting from two implantation steps may be formed.

It is explicitly noted that the third implantation process IMP3 as described above with regard to FIG. 4 is optional and, in some illustrative embodiments of the present disclosure, the semiconductor device 300A as described above with regard to FIG. 3b may not be exposed to any further processing as described above with regard to FIG. 4. In some alternative illustrative embodiments, a plurality of semiconductor devices corresponding to the semiconductor device 300A as described above with regard to FIG. 3b may be exposed to further processing as described above with regard to FIG. 4, while another plurality of semiconductor devices corresponding to the semiconductor device 300A as described above with regard to FIG. 3b is not exposed to any further processing as described above with regard to FIG. 4. Particularly, the semiconductor device structure may comprise a plurality of semiconductor devices, wherein a subset of the plurality of semiconductor devices comprises semiconductor devices with a gate stack directly formed on the active region, i.e., without any silicon germanium layer disposed in between. A part of the subset may be exposed to the third implantation process IMP3 as described above with regard to FIG. 4, while another part of the subset may be protected from the third implantation process IMP3. Particularly, a part of the subset may represent semiconductor devices having a gate stack formed directly on an active region, wherein slightly doped halo regions are formed within the active region, and another part represents semiconductor devices with a gate stack formed directly on an active region which only has dopants of group 3 elements implanted therein. These illustrative embodiments of the present disclosure will now be described in greater detail with regard to FIGS. 5a-5c.

It is noted that the terms "only dopants of group 3 elements" or "only dopants of group 5 elements" are to be understood as that, aside a possible pre-doping of the semiconductor substrate, no further doping by group 3 elements or group 5 elements is achieved by implanting group 3 or group 5 elements into the semiconductor devices as described herein with regard to FIGS. 2a to 5c.

Figure 5A:
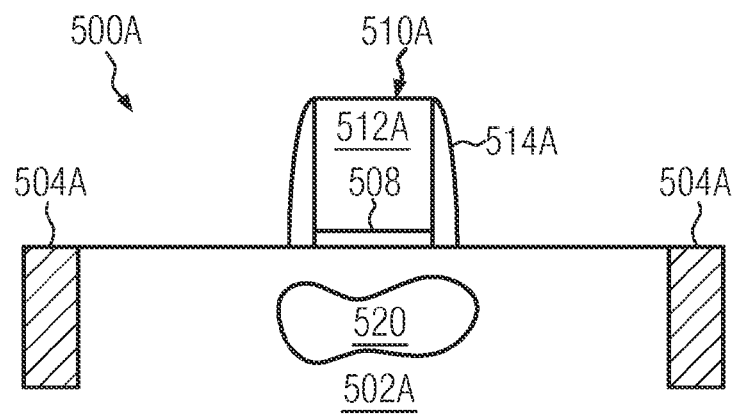
FIGS. 5a-5c schematically show in cross-sectional views different types of semiconductor devices in accordance with some illustrative embodiments of the present disclosure.
Figure 5B:
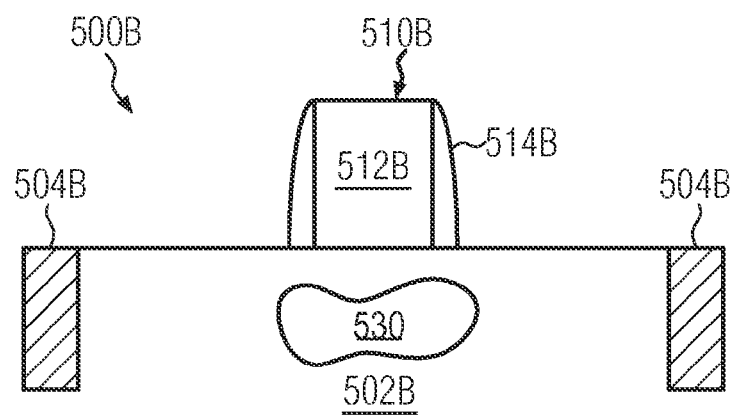
Figure 5C:
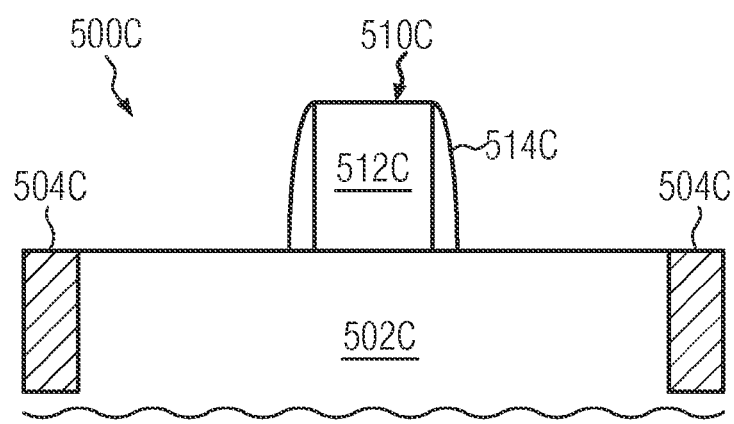

FIGS. 5a-5c schematically illustrate different types of semiconductor devices in accordance with illustrative embodiments of the present disclosure. Particularly, the semiconductor devices as depicted in FIGS. 5a-5c represent semiconductor devices at more advanced stages during fabrication, particularly after the implantation process IMP2 or the implantation processes IMP2 and IMP3 have been performed.

FIG. 5a schematically shows a cross-sectional view of a semiconductor device 500A formed in and over an active region 502A. The active region 502A is defined by STI regions 504A. The semiconductor device 500A comprises a gate electrode structure 510A provided by a gate stack 512A disposed on a silicon germanium layer 508. A sidewall spacer structure 514A is formed adjacent to the gate stack 512A. The semiconductor device 500A may correspond to one of the semiconductor devices 300B and 400B as described with regard to FIGS. 3b and 4 above. Particularly, halo regions 520 formed within the active region 502A under the gate electrode structure 510A correspond to one of the halo regions 320 and 420 as discussed above with regard to FIGS. 3b and 4. It is noted that semiconductor device 500A corresponds to a PMOS device of one of an LVT type and an RVT type.

FIG. 5b depicts schematically a semiconductor device 500B formed in and on an active region 502B which is defined by STI regions 504B. The semiconductor device 500B comprises a gate electrode structure 510B provided by a gate stack 512B and a sidewall spacer structure 514B formed adjacent to the gate stack 512B. The gate stack 512B is disposed on the active region 502B without any silicon germanium layer formed in between. The semiconductor device 500B further comprises halo regions 530 formed within the active region 502B under the gate electrode structure 510B. The semiconductor device 500B as depicted in FIG. 5b corresponds to the semiconductor device 400A as described above with regard to FIG. 4, after the third implantation process IMP3 has been performed such that the halo regions 530 of the semiconductor device 500B correspond to the halo regions 430 of the semiconductor device 400A. Particularly, a concentration of N-type dopants within the halo regions 530 is lower than a concentration of N-type dopants within the halo regions 520 in accordance with the discussion of the halo regions 430 and 420 in FIG. 4 above. The semiconductor device 500B represents a PMOS device of an SHVT type.

FIG. 5c schematically depicts a semiconductor device 500C formed in and on an active region 502C which is defined by STI regions 504C. The semiconductor device 500C comprises a gate electrode structure 510C formed on the active region 502C. The gate electrode structure 510C is provided by a gate stack 512C and a sidewall spacer structure 514C formed adjacent to the gate stack 512C. Particularly, the gate stack 512C is formed directly on the active region 502C such that no silicon germanium layer is disposed in between. The active region 502C is only doped with dopants of group 3 elements. The person skilled in the art appreciates that the expression "only doped with dopants of group 3 elements" does not pose any limitation on an N-type doping of the active region 502C that is initially provided as, for example, discussed with regard to FIG. 2b above. It is intended to indicate that no halo region as corresponding to one of the halo regions 520 and 530 is present within the active region 502C of the semiconductor device 500C. Particularly, the semiconductor device 500C is not exposed to the second implantation process IMP2 and/or the third implantation process IMP3. The semiconductor device 500C is only exposed to implantation processes that implant dopants into the semiconductor device 500C along an implantation direction that is substantially perpendicular to an exposed upper surface of the active region 502C. That is, no implantation process implanting dopants along an implantation direction that deviates from a normal direction of an upper surface of the active region 502C is applied to the semiconductor device 500C. The semiconductor device 500C represents a PMOS device of an HVT type.

Figure 6:
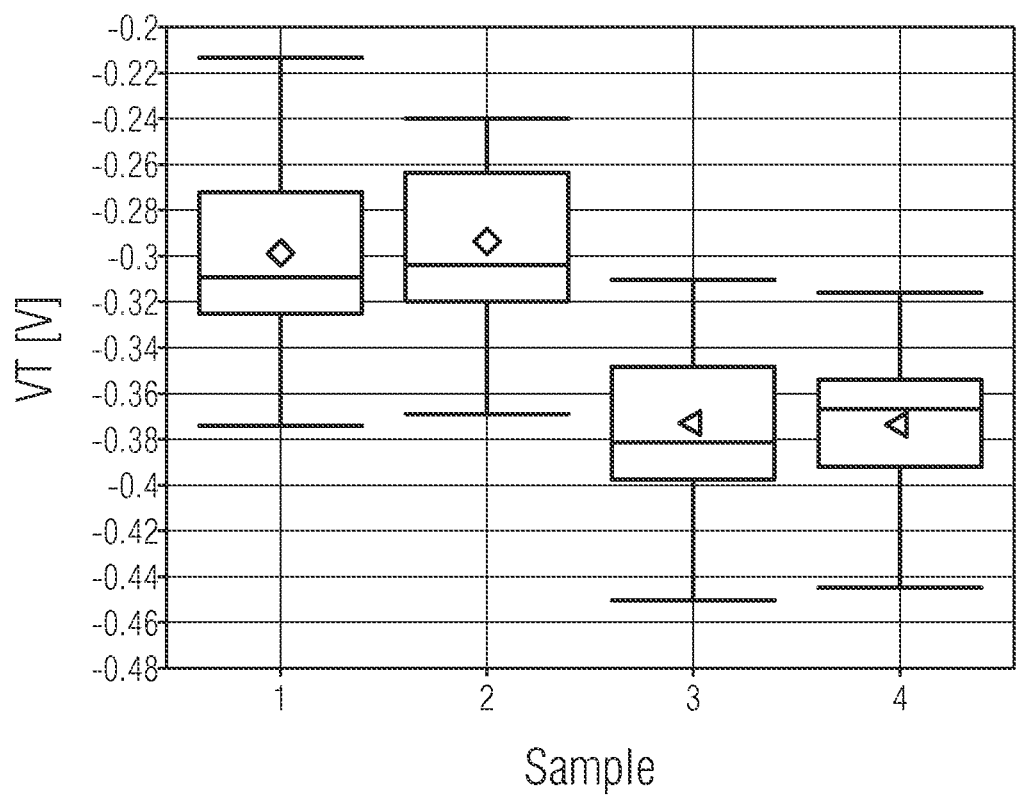
FIG. 6 schematically shows results of measurements performed by the inventors.

The inventors understood that the thickness of the silicon germanium layer has a significant impact on the threshold voltage of PMOS devices. As discussed above, high threshold voltages are required for HVT and SHVT devices. In standard HK/MG technologies, the differences in the threshold voltage of the various types of semiconductor devices is compensated for and adjusted by means of implantation steps which require additional masking and implantation sequences. The inventors understood that, typically, an increased halo dose is used for threshold voltage compensation and that a much higher halo dose is required in the case of SHVT devices, which the inventors observed to cause additional performance degradation in most cases, as discussed above with regard to FIG. 1. The inventors further understood by excluding the silicon germanium layer from HVT and SHVT devices, the threshold voltage of SHVT and HVT devices increases without the need of any implant compensation. FIG. 6 shows results obtained by the inventors when measuring the threshold voltage (indicated by VT on the ordinate, units in Volts) for different wafer sample devices (indicated by numbers 1, 2, 3 and 4) along the abscissa. Herein, wafer sample devices 1 and 2 comprised semiconductor devices with silicon germanium layers having thicknesses of about 100 Å. As opposed to wafer sample devices 1 and 2, wafer sample devices 3 and 4 comprise semiconductor devices with silicon germanium layers having thicknesses of about 75 Å. The inventors observed that, in reducing the thickness of the silicon germanium layer, a shift in the threshold voltage to a higher absolute value may be achieved. The inventors understood that, when excluding the silicon germanium layer from HVT and SHVT devices, this results in a shift of the threshold voltage of about 100 millivolt (mV) for these devices. It is, therefore, possible to at most employ an additional fine-tuning to SHVT devices of about 40-60 millivolt (mV) per halo dose adjustment such that HVT and SHVT devices of the present disclosure only use a very little implant dose compensation, if necessary. Therefore, the device performance of semiconductor devices of the present disclosure is not negatively affected and the implant dose concentration may be kept at low levels, resulting in improvements in the die variation.

The present disclosure provides semiconductor device structures with a first PMOS active region and a second PMOS active region provided within a semiconductor substrate. A silicon germanium channel layer is only formed over the second PMOS active region. Gate electrodes are formed over the first and second PMOS active regions, wherein the gate electrode over the second PMOS active region is formed over the silicon germanium channel.

Furthermore, the present disclosure provides a method for forming PMOS semiconductor devices, wherein a silicon germanium channel overlying a channel region of a PMOS transistor to be fabricated is only selectively formed in different active regions. A halo implantation dose for halo implantation processes which are subsequently performed is reduced for PMOS device structures in active regions not having silicon germanium channels.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device structure, comprising:
   providing a first PMOS active region and a second PMOS active region in a semiconductor substrate;
   forming a first masking pattern over said first PMOS active region;
   forming a silicon germanium layer over said second PMOS active region in accordance with said first masking pattern;
   removing said first masking pattern;
   forming gate electrode structures over said first and second PMOS active regions;
   forming a second masking pattern over said first PMOS active region subsequently to said formation of gate electrode structures;
   performing a first implantation process in the presence of said second masking pattern with a first halo implant dose for forming halo regions in said second PMOS active region;
   removing said second masking pattern;
   forming a third masking pattern over said second PMOS active region; and
   performing a second implantation process in the presence of said third masking pattern with a second halo implant dose for forming lightly doped halo regions in said first PMOS active region, said second halo implant dose being substantially smaller than said first halo implant dose.

2. The method of claim 1, further comprising performing one or more implantation processes for implanting dopants into said first PMOS active region, wherein said dopants are implanted along a direction substantially normal to an exposed surface of said first PMOS active region.

3. The method of claim 1, wherein said second halo implant dose is substantially less than 3.3E13 atoms/cm$^2$.

4. A method of forming a semiconductor device structure, comprising:
   providing a semiconductor substrate with a first PMOS active region and a second PMOS active region, of which only said second active region has a silicon germanium layer formed thereon;
   forming a first PMOS device on said first PMOS active region, said first PMOS device comprising a first gate electrode structure;
   forming a second PMOS device over said second PMOS active region, said second PMOS device comprising a second gate electrode structure formed on said silicon germanium layer;
   performing a first implantation process for forming halo regions in said second PMOS active region at opposing sides of said second gate electrode structure while said first PMOS active region is protected by a first masking pattern from being exposed to said first implantation process; and
   performing a second implantation process for forming halo regions in said first PMOS active region subsequent to said first implantation process while said second PMOS region is protected by a second masking pattern, wherein an implantation dose of said second implantation process is substantially smaller than an implantation dose of said first implantation process.

5. The method of claim 4, further comprising performing one or more doping implantation processes into said first PMOS active region, wherein said one or more doping implantation processes are substantially normal to an exposed surface of said first PMOS active region.

* * * * *